Feb. 21, 1967 F. A. PIZZARELLO 3,305,412

METHOD FOR PREPARING A GALLIUM ARSENIDE DIODE

Filed Feb. 20, 1964

2 Sheets-Sheet 1

INVENTOR.
FRANK A. PIZZARELLO,
BY John M. Koch
ATTORNEY.

Feb. 21, 1967 F. A. PIZZARELLO 3,305,412

METHOD FOR PREPARING A GALLIUM ARSENIDE DIODE

Filed Feb. 20, 1964 2 Sheets-Sheet 2

INVENTOR.
FRANK A. PIZZARELLO,
BY John M. Koch
ATTORNEY 3,305,412

METHOD FOR PREPARING A GALLIUM ARSENIDE DIODE

Frank A. Pizzarello, Santa Ana, Calif., assignor to Hughes Aircraft Company, Culver City, Calif., a corporation of Delaware Filed Feb. 20, 1964, Ser. No. 346,267
9 Claims. (Cl. 148—189)

This invention relates to the production of p-n junctions in gallium arsenide for the fabrication of a gallium arsenide diode, and particularly to a method for the production of a uniformly flat or planar zinc diffused p-n junction in a gallium arsenide diode.

Among gallium arsenide devices employing p-n junctions are the incoherent infrared diode and the injection laser using gallium arsenide. These two diodes are similar in structure and operation. The discovery of the emission of coherent light by the passage of a high electric current through a gallium arsenide semiconductor p-n junction has focused attention upon the quality of the p-n junction, including freedom from mechanical and chemical defects and a high degree of planarity. Zinc diffusion in gallium arsenide semiconductor generally is used to produce the p-n junction. While using prior art methods for diffusing zinc into gallium arsenide, difficulties were experienced in that the junctions produced were mechanically or chemically defective and were not uniformly flat.

Accordingly, it is an important object of this invention to produce a method for diffusing zinc into a gallium arsenide semiconductor in a manner to produce a high quality p-n junction.

Another object of this invention is to produce a method for consistently fabricating highly planar p-n junctions in gallium arsenide semiconductor by zinc diffusion.

Additional objects of this invention will become apparent from the following description which is given primarily for purposes of illustration, and not limitation.

Stated in general terms, the objects of this invention are attained by diffusing zinc vapor into gallium arsenide at a zinc partial pressure below that at which zinc reacts with the gallium arsenide at the diffusion temperature being used.

A more detailed description of the invention is given below with reference to the accompanying drawings, wherein.

Figure 1:
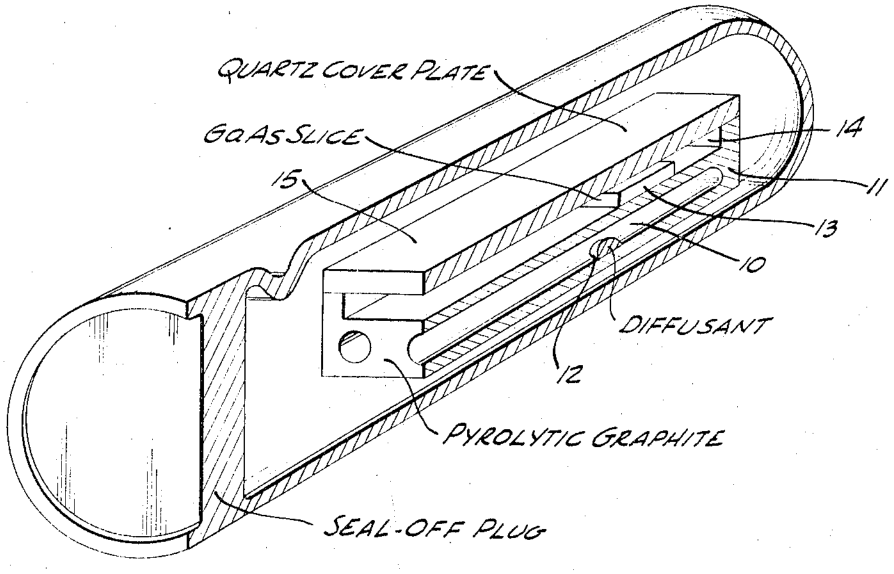
FIG. 1 is a scchematic isometric view with portions cut away showing a quartz diffusion couple used to produce the p-n junction in accordance with the method of the invention.
Figure 2:
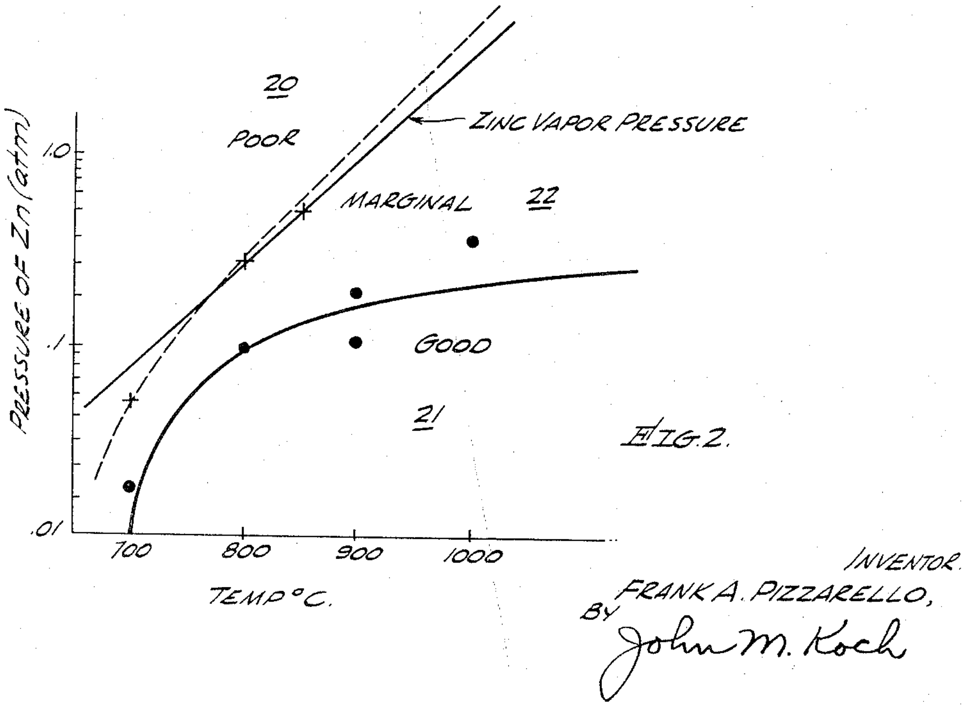
FIG. 2 is a graph showing the various quality p-n junctions produced under conditions of varying zinc pressure and temperature.

In a specific example, a slice of gallium arsenide semiconductor 0.020 inch thick is cut from an ingot, polished mechanically to a high specular finish and cleaned in an ultrasonic cleaner. The source well 10 in pyrolytic graphite holder 11 was provided with zinc diffusant 12. Pyrolytic graphite is used both for its chemical inertness with gallium arsenide and its high heat capacity to minimize condensation of diffusant in the gas phase on the gallium arsenide surface during cooling. The cleaned slice of gallium arsenide 13 was placed on the thermal coordinator 14 of holder 11 and quartz cover plate 15 was placed over the holder to protect the gallium arsenide surface against spattering of the diffusant. The resulting assembly was placed inside quartz tube 16, as shown in FIG. 2. The free volume of tube 16 available for the expansion of diffusant to the gas state was fixed at about 10.6 cc. Tube 16 was attached to a vacuum system and evacuated to $10^{-6}$ mm. Hg. Argon then was introduced to yield 1 atmosphere pressure at the diffusion temperature.

It was found, unexpectedly, that when the zinc partial pressure was kept below about 0.24 atmosphere when conducting the diffusion of zinc into the galluim arsenide slice at about 800° C., highly planar p-n junctions were repeatedly produced. Further work was done to determine the zinc diffusion temperature dependence of the planar p-n junctions.

In most of the preparations a single ingot of Bell and Howell Czochraliski grown material was used. This ingot was n-type material with a resistivity of 2 to $3\times10^{-3}$ Ω cm. and a carrier concentration of $7\times10^{17}$/cc. In two preparations, horizontal Bridgman material was used. This material was n-type with a resistivity of $4\times10^{-3}$ and carrier concentration of $3\times10^{17}$/cc. Sample preparation followed the procedure of slicing the ingot on the (100) plane, polishing one surface to a high specular finish on pitch with Linde A, and lapping the other side with 6$\mu$ $Al_2O_3$ grit to a thickness of .0508 cm. Following this procedure, the slices were thoroughly rinsed in alcohol in an ultrasonic cleaner.

The prepared slices were weighed and placed in a diffusion tube with the appropriate quantity of diffusant. In the case where a diffusant of a mixture of Zn and As was used, the tube was sealed off evacuated. Where only Zn was used as the diffusant, the tube was back-filled with sufficient argon to yield 1 atmosphere pressure at the diffusion temperature. Diffusion of Zn was performed in the flattest portion of the thermal distribution of the furnace; a 4° variation in temperature was measured over the length of the tube. The temperature was controlled to within 1% by an L and N proportional band controller.

The resultant diffused slice was cross-sectioned and mounted for viewing under a microscope. The p-n junction was delineated by etching in a freshly made solution of 1 part HF, 3 parts $HNO_3$ and 2 parts $H_2O$. A 30-second etch is usually sufficiently long to clearly resolve the junction interface. To serve as a check on the precision of the 1–3–2 etch in delineating the junction, a copper staining solution was also used. The junction depth using either solution agreed within experimental error.

A study of the data obtained showed that the relationship of the zinc diffusion pressure and the diffusion temperature to the planarity of the p-n junction was evident. FIG. 2 shows the relation between the critical zinc pressure and temperature. Three regions are described by FIG. 2.

In the region 20 labeled "poor," a junction containing many peaks and valleys reduces to a wavy interface, and the "good" region 21 is where the p-n junction interface is planar. A "marginal" region is shown at 22.

A mechanism based on the chemical reaction:

$$2GaAs(s)+3Zn(g)\rightarrow Zn_3As_2(s)+2Ga \quad (1)$$

can be devised that is consistent with the data obtained. The equilibrium constant for Reaction 1 is $$K_1=\frac{1}{P_{Zn}{}^3}$$

where $P_{Zn}$ is the equilibrium partial pressure of zinc. Thus it can be seen that the reactions postulated are zinc pressure dependent alone. Thus if the pressure of zinc during diffusion does not exceed the equilibrium partial pressure demanded by Equation 1, no $Zn_3As_2$ is formed. Conversely, if the zinc pressure exceeds the equilibrium partial pressure, $Zn_3As_2$ is formed at the surface, producing sites where the diffusion rate is different from the surface not affected. Assuming the chemical reaction postulated to be correct, the curve separating the good region in FIGURE 2 shows the approximate functional dependence of zinc equilibrium pressure on temperature.

Figure 3:
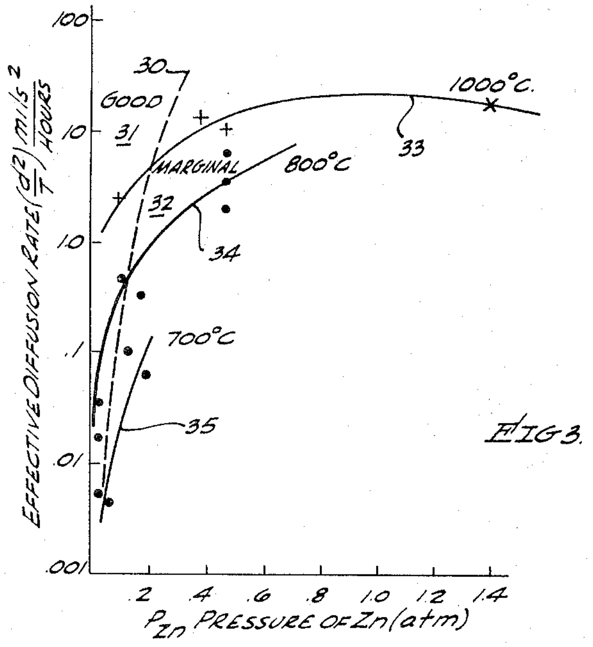
FIG. 3 is a graph showing the relationship of the effective diffusion rate to the diffusion pressure of zinc calculated from the volume and mass of zinc in the diffusion atmosphere.

A plot of $d^2/t$ versus pressure of zinc is given in FIG. 3. The expression $d^2/t$ where $d$ is the junction depth and $t$ is the diffusion time was chosen because it is related to the diffusion coefficient. It is seen in these curves that the diffusion rate moves from a highly zinc pressure dependent region to a region of a small Zn pressure dependence. The dotted line 30 given in FIG. 3 separates the region 31 where "good" quality junctions are obtained from the "marginal" region 32 where marginal quality junctions are obtained. A flattening of the curves 33, 34 and 35 in FIG. 3 is indicative of changes of the surface concentration or the diffusion coefficient, or both. In every case, however, the effect observed is caused by a change at the surface of the GaAs. In the past, diffusion profiles of zinc in GaAs were reported which departed drastically from the predictions of Fick's law based on a solid-gaseous diffusion couple. In accordance with the instant findings, these departures from theory may be explained by assuming a boundary condition where an intermediate solid zinc-arsenic phase exists at the GaAs surface.

A series of preparations were made while using an arsenic ambient. FIG. 2 shows the marginal region 22 becomes larger at elevated temperatures. At these high temperatures, thermal decomposition of GaAs proceeds to a greater extent, thus producing pits and erosion at the surface. The pitted sites act as points of high rate of diffusion to contribute to the total non-planarity of the junction interface. To avoid or diminish the decomposition, arsenic pressure over GaAs was employed. To study the effect of arsenic pressure on the rate of diffusion, on the quality of the p-n junction interface, and on the extent of surface erosion, a diffusion couple containing a sufficient weight of arsenic ($As_4$) to yield 1 atmosphere of pressure at a diffusion temperature of 1000° C. where assembled. With each diffusion a varying amount of zinc was used and the resultant slices of GaAs were inspected for quality of junction, depth of junction, and erosion of surface. The results of these experiments are given in FIG. 4.

Figures 4, 5:
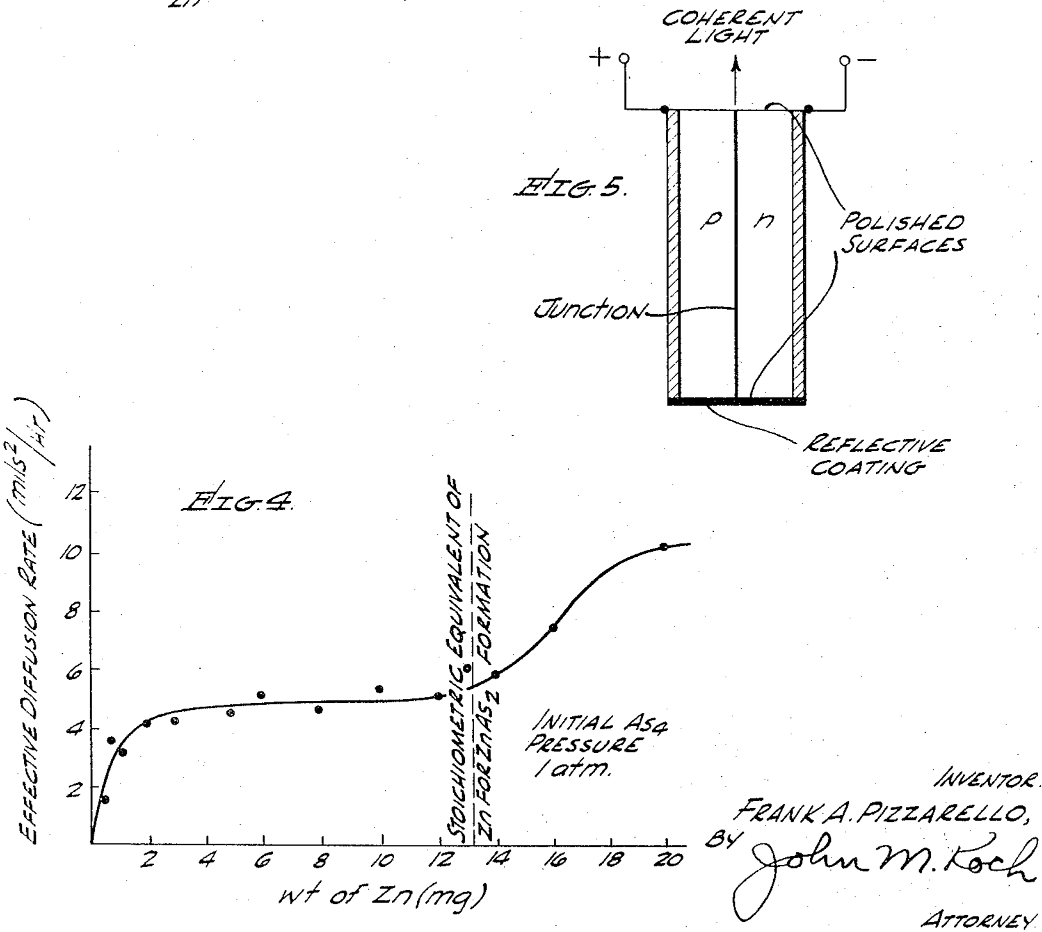
FIG. 4 is a graph showing the relationship between the effective diffusion rate of zinc to the weight of zinc initially introduced to the diffusion couple.
FIG. 5 is a schematic sectional view showing the p-n junction and basic elements of a gallium arsenide injection laser.

The several features of the curve in FIG. 4 which are of interest are:

(1) The rapid rise of the effective diffusion rate with Zn weights greater than 13.2 mg.

(2) The rapid rise of $d^2/t$ at small zinc weights leading to the general flattening of the curve.

(3) The magnitude of $d^2/t$ at zinc weights greater than 13.2 mg. of Zn.

A stoichiometric weight of 13.2 mg. of Zn is calculated for the complete reaction of As to form $ZnAs_2$. Couple this fact with the lower magnitude of the effective diffusion rate observed in this experiment and those observed in the pure zinc experiments (FIGURE 4) and it becomes evident that the equilibrium reaction $$ZnAs_2(g) \rightleftharpoons Zn(g) + As_2(g) \qquad (2)$$

occurs. The equilibrium constant for this reaction is $$K_2 = \frac{P_{Zn} P_{As_2}}{P_{ZnAs_2}}$$

The point on the curve in FIG. 5 (marked as stoichiometric weight of Zn) where a rapid rise in the effective diffusion rate occurs is where free arsenic in the vapor phase no longer exists.

The general characteristics exhibited by the curve at zinc weights under the stoichiometric weight can be explained by postulating the following equilibrium process. First, it is assumed that the sharp initial rise of $d^2/t$ at low zinc weights occurs because greater amounts of zinc are entering the gas phase as zinc is added to the couple. At the knee of the curve the vapor is saturated with $ZnAs_2$ and a liquid phase of $ZnAs_2$ begins to appear. Through the flattened region of the curve the condensed phase of $ZnAs_2$ persists, thus keeping total pressure of the gas constant. Assuming further that the value of $d^2/t$ in the flat portion of the curve is related to the partial pressure of zinc shown in FIG. 3, the equilibrium constant for the Reaction 2 can be estimated. The pressure of zinc given in FIG. 3 for the appropriate value of $d^2/t$ is $P_{Zn}=.24$ atmosphere. The relations giving the value of the pressure of $ZnAs_2$ and $As_2$ are respectively $$P_{ZnAs_2} = n'_{Zn}\frac{RT}{V} - P_{Zn}$$

and $P_{As_2} = P'_{As_2} - P_{ZnAs_2}$ where $n'_{Zn}$ is the number of moles of zinc at the point where liquid $ZnAs_2$ just appears (4 mg.), $P'_{As_2}$ is the pressure of arsenic initially introduced and R, T, V, are defined as the gas constant, temperature and volume. Substitution of the equation for partial pressures into the relation for the equilibrium constant $K_2$, the expression $$K_2 = \frac{\left(P'_{As_2} + P_{Zn} - n_{Zn'}\frac{RT}{V}\right)}{n_{Zn'}\frac{RT}{V} - P_{Zn}} P_{Zn}$$

is obtained. Using the value $P_{As_2}=2$ atmospheres, and the appropriate values given in the text above, a value of $K=1.1$ atmospheres is obtained. Using this value of K a value $\Delta F=0.23$ Kcal. from the equation $\Delta F = 1RT$ 1nK is obtained.

If one assumes the reaction $$Zn(g) + GaAs(s) \rightleftharpoons ZnAs_2(g) + Ga(1) \qquad (3)$$

occurs at the surface of the diffusion sample an estimate of the extent of this reaction can be made using the free energy data calculated above and from free energy data of the decomposition of GaAs. An estimate of ΔF of 8.2 Kcal./mole for GaAs decomposition was made from data published by J. van den Boomgaard and K. Schol [6]. The ΔF for Reaction 3 was calculated to 8.0 Kcal. From the sign and magnitude of the free energy data, it is clear that Reaction 3 proceeds only to a slight extent as written. Consequently, the reaction contributes little or none to the non-planarity of the p-n junction interface.

Comparing the magnitude of $d^2/t$ of FIG. 4 at zinc weights above the stoichiometric equivalent with the data of $d^2/t$ of FIG. 3 it is found upon calculating the zinc pressure due to the zinc in excess of the stoichiometric weight that similar values are obtained. Also it is found that severe erosion and pitting of the surface begins at $d^2/t$ value of approximately 6, a value very close to the onset of marginal junctions as shown in FIG. 3.

In view of these data it is reasonable to conclude that at these higher zinc weights the chemical process described in the above section commences.

To further verify the conclusions made, powder patterns of the solid material found on the wall of the tube 16 were taken. These patterns show no presence of free Zn or As and give strong evidence of the existence of $ZnAs_2$. In identifying the unknown species from the powder pattern, the crystallographic data reported by M. V. Stackelbery and R. Paulus were used.

Thus there are effects occurring on the surface of the GaAs which strongly affect the nature of the planarity of the p-n junction. It was demonstrated that extremely poor p-n junctions are obtained at diffusion below 800° C. when zinc pressure exceeds a critical value. Marginal p-n junctions are obtained due both to reaction of zinc with the GaAs surface, and to thermal erosion caused by the decomposition of GaAs. It was show that various equilibrium reactions of Zn occur with the GaAs surface and As. These reactions govern the nature and quantity of Zn at the GaAs surface in such a manner as to affect the mechanism of diffusion into the solid. It is not intended here to exclude the importance of such items as mechanical defects or chemical impurities from general problems of non-planarity, but rather to define the form each effect takes in the system.

The gallium arsenide semiconductor slice provided with the planar zinc diffused p-n junction, as described in the preparations given herein above, is fabricated into a suitable semiconductor device, such as, for example, a gallium arsenide injection laser, as shown in FIG. 5, by the use of techniques known and employed by persons skilled in the art.

Obviously many other modifications and variations of the present invention are possible in the light of the above teachings. It is therefore to be understood that within the scope of the appended claims the invention can be practiced otherwise than as specifically described.

What is claimed is:

1. A gallium arsenide semiconductor device having a zinc diffused planar p-n junction produced by diffusing zinc into the gallium arsenide at a zinc partial pressure and temperature at which zinc does not react with gallium arsenide.

2. A gallium arsenide semiconductor device having a zinc diffused planar p-n junction produced by diffusing zinc into the gallium arsenide at the zinc partial pressure below the equilibrium partial pressure for the diffusion temperature at which zinc reacts with gallium arsenide.

3. A gallium arsenide semiconductor device having a zinc diffused planar p-n junction produced by diffusing zinc into the gallium arsenide at a zinc partial pressure and temperature within the good area 21 shown in FIG. 2 of the drawings.

4. A gallium arsenide semiconductor device having a zinc diffused planar p-n junction produced by diffusing zinc into the gallium arsenide at a zinc partial pressure and effective diffusion rate within the good area 21 shown in FIG. 3 of the drawings.

5. A gallium arsenide semiconductor device having a zinc diffused planar p-n junction substantially free from the compound $ZnAs_2$ produced by diffusing zinc into the gallium arsenide at a temperature in the range from about 700° C. to about 1000° C. and at a zinc partial pressure below about 0.24 atmosphere.

6. In a method for the production of a gallium arsenide semiconductor device containing a zinc diffused planar p-n junction, the improvement which consists of diffusing zinc into the gallium arsenide at a zinc partial pressure and temperature at which zinc does not react with gallium arsenide.

7. In a method for the production of a gallium arsenide semiconductor device containing a zinc diffused planar p-n junction, the improvement which consists of diffusing zinc into the gallium arsenide at a zinc partial pressure below the equilibrium partial pressure for the diffusion temperature at which zinc reacts with gallium arsenide.

8. In a method for the production of a gallium arsenide semiconductor device containing a zinc diffused planar p-n junction, the improvement which consists of diffusing zinc into the gallium arsenide at a zinc partial pressure and temperature within the good area 21 shown in FIG. 2 of the drawings.

9. In a method for the production of a gallium arsenide semiconductor device containing a zinc diffused planar p-n junction, the improvement which consists of diffusing zinc into the gallium arsenide at a temperature in the range from about 700° C. to about 1000° C. and at a zinc partial pressure below about 0.24 atmosphere.

References Cited by the Examiner

UNITED STATES PATENTS

| | | | |
|---|---|---|---|
| 2,900,286 | 8/1959 | Goldstein | 148—189 |
| 3,178,798 | 4/1965 | Marinace | 148—189 X |
| 3,183,131 | 5/1965 | Huffman | 148—189 |
| 3,245,002 | 4/1966 | Hall | 331—94.5 |

OTHER REFERENCES

HYLAND BIZOT, *Primary Examiner.*